United States Patent [19]

Robeck et al.

[11] Patent Number: 5,087,383

[45] Date of Patent: Feb. 11, 1992

[54] NOVEL AZEOTROPIC OR AZEOTROPE-LIKE MIXTURE OF 2,2,2-TRIFLUOROETHYL 1,1,2,2-TETRAFLUOROETHYL ETHER AND ETHANOL, AND ITS USE

[75] Inventors: Horst Robeck; Hans-Matthias Deger, Both of Hofheim am Taunus, Fed. Rep. of Germany

[73] Assignee: Hoechst Aktiengesellschaft, Frankfurt am Main, Fed. Rep. of Germany

[21] Appl. No.: 690,659

[22] Filed: Apr. 24, 1991

[30] Foreign Application Priority Data

Apr. 26, 1990 [DE] Fed. Rep. of Germany ....... 4013369

[51] Int. Cl.$^5$ .................... C11D 7/30; C11D 7/50; C23G 5/028; B08B 3/00
[52] U.S. Cl. ............................. 252/171; 134/12; 134/31; 134/38; 134/39; 134/40; 203/67; 252/162; 252/170; 252/364; 252/DIG. 9
[58] Field of Search ............... 252/162, 170, 171, 172, 252/364, DIG. 9, 67; 134/12, 31, 38, 39, 40; 203/67

[56] References Cited

U.S. PATENT DOCUMENTS

| | | | |
|---|---|---|---|
| 3,394,878 | 7/1968 | Eiseman ............................... | 252/67 |
| 3,409,555 | 11/1968 | Eiseman ............................... | 252/67 |
| 3,609,196 | 9/1971 | Terrell ................................. | 252/171 |
| 3,960,746 | 6/1976 | Gorski ................................. | 252/171 |
| 3,981,927 | 9/1976 | Siegemund et al. ............. | 260/614 F |
| 3,987,111 | 10/1976 | Terrell .............................. | 260/614 F |
| 4,041,148 | 8/1977 | Simons et al. ........................ | 424/45 |
| 4,104,314 | 8/1978 | Terrell .............................. | 260/614 F |
| 4,139,607 | 2/1979 | Simons et al. ........................ | 424/45 |
| 4,541,943 | 9/1985 | Powell ................................. | 252/67 |
| 4,559,154 | 12/1985 | Powell ................................. | 252/69 |
| 4,948,526 | 8/1990 | Fellows et al. ...................... | 252/69 |
| 4,999,127 | 3/1991 | Merchant ............................ | 252/171 |

FOREIGN PATENT DOCUMENTS

| | | |
|---|---|---|
| 1026003 | 4/1966 | United Kingdom . |
| 1399867 | 7/1975 | United Kingdom . |
| 2220951 | 1/1990 | United Kingdom . |

OTHER PUBLICATIONS

Chemical Abstract No. 102:165172v abstract of Shere et al. "Extractive Fermentation using Fluorinated Hydrocarbons" Can. Bioenergy R & D Semin., Proc. J., 5th 1984 pp. 548-552.

Primary Examiner—Paul Lieberman
Assistant Examiner—Linda D. Skaling

[57] ABSTRACT

The invention relates to a novel azeotropic or azeotrope-like mixture which essentially comprises about 90-97% by mass of 2,2,2-trifluoroethyl 1,1,2,2-tetrafluoroethyl ether and about 3-10% by mass of ethanol and also to a process for cleaning electrical or electronic components, in particular soldered circuit boards or printed circuits, but also other solid surfaces, with the aid of said mixture. Soldering fluxes, in particular, can be removed from circuit boards with the aid of said mixture.

8 Claims, No Drawings

NOVEL AZEOTROPIC OR AZEOTROPE-LIKE MIXTURE OF 2,2,2-TRIFLUOROETHYL 1,1,2,2-TETRAFLUOROETHYL ETHER AND ETHANOL, AND ITS USE

DESCRIPTION

The invention relates to a novel azeotropic or azeotrope-like mixture of 2,2,2-trifluoroethyl 1,1,2,2-tetrafluoroethyl ether, $CF_3CH_2OCF_2CF_2H$, and ethanol, which can be used to clean electrical and electronic components.

After soldering operations carried out on electrical and electronic components, the excess soldering flux is in general removed again. To clean soldered circuit boards and other electronic components, for example, mixtures of 1,1,2-trichloro-1,2,2-trifluoroethane (R 113) and alcohols such as methanol, ethanol or 2-propanol are used (British Patent 1,026,003, British Patent 1,399,867). U.S. Pat. No. 3,960,746 discloses an azeotrope-like mixture of R 113, methanol and nitromethane. However, since the chlorofluorocarbons are suspected of damaging the ozone layer, it is necessary to develop chlorine-free substitutes.

Chlorine-free substitutes are, for example, solvent mixtures with an aqueous base or unhalogenated organic solvents. In the case of aqueous cleaning agents, however, it is difficult to find the right surfactant/complexing agent combination. The system also has to be matched to the mechanical treatment such as rinsing, brushing, steam jet treatment or ultrasound. In the case of SMT (surface mount technology), aqueous cleaning systems are often ruled out since the water underneath the components can only be removed with difficulty. If unhalogenated organic solvents such as petrol, alcohol, terpenes or esters are used, an explosion-protected design of the plant is necessary because of the flammability and the explosiveness of these substances, with the result that use is only possible in certain cases for economic reasons. The non-prepublished German Patent Application P 4,002,120.3 describes an azeotrope-like solvent mixture of 1,4-dihydroperfluorobutane and methanol which is suitable for cleaning electrical and electronic components.

Surprisingly, it has now been found that 2,2,2-trifluoroethyl 1,1,2,2-tetrafluoroethyl ether, $CF_3CH_2OCF_2CF_2H$, forms with ethanol an azeotropic or azeotrope-like solvent mixture which is outstandingly suitable for cleaning electrical and electronic components, in particular soldered circuit boards or printed circuits, especially for removing the soldering flux.

One subject of the invention is therefore an azeotropic or azeotrope-like mixture which essentially comprises an effective quantity of 2,2,2-trifluoroethyl 1,1,2,2-tetrafluoroethyl ether and ethanol.

In general, the mixture essentially comprises 90–97% by mass of 2,2,2-trifluoroethyl 1,1,2,2-tetrafluoroethyl ether and about 3–10% by mass of ethanol. Preferably, the mixture comprises about 92–95% by mass, in particular 93.6–93.8% by mass of 2,2,2-trifluoroethyl 1,1,2,2-tetrafluoroethyl ether, the remainder being substantially ethanol in all cases.

A further subject of the invention is a process for cleaning electrical or electronic components, in particular soldered circuit boards or printed circuits, which comprises washing the components with an azeotropic or azeotrope-like mixture which essentially comprises about 90–97% by mass of 2,2,2-trifluoroethyl 1,1,2,2-tetrafluoroethyl ether and about 3–10% by mass of ethanol. Preferably, a mixture is used which comprises 92–95% by mass, in particular 93.6–93.8% by mass, of 2,2,2-trifluoroethyl 1,1,2,2-tetrafluoroethyl ether, the remainder essentially being ethanol in all cases.

A particularly preferred solvent mixture essentially comprises 93.7% by mass of 2,2,2-trifluoroethyl 1,1,2,2-tetrafluoroethyl ether and 6.3% by mass of ethanol and has a boiling point of 53.1° C. at 1 bar.

In the mixture according to the invention, the composition of the vapor is identical, or essentially identical, to the composition of the liquid, i.e. the composition of the mixture does not, or does not substantially, change on evaporation.

The solvent mixture according to the invention has the advantage that it contains no chlorine and, consequently, does not bring about any ozone damage. In addition, it is noncombustible and can be used in the standard ultrasonic, dipping or brushing plants for cleaning electronic components. In addition, the cleaning times of electronic components with the mixture according to the invention are up to 80% shorter compared with the conventional agents. Moreover, ionic residues on the electronic components can be removed better than with the conventional mixtures.

2,2,2-Trifluoroethyl 1,1,2,2-tetrafluoroethyl ether (CAS No. 406/78/0) can be prepared by reacting $CF_3CH_2OH$ with $F_2C=CF_2$ in the presence of a base (such as NaOH) in a solvent (such as N-methylpyrrolidone).

The cleaning effect of the novel solvent mixture will be demonstrated by way of example with reference to three selected soldering fluxes.

EXAMPLE 1

A glass fiber/reinforced base material for circuit boards with a polyester base was coated with a commercial soldering flux ("Zeva C20-200" supplied by the Zevatron company, the main constituent of which is, apart from activators, colophony) and dried for 18 hours at 60° C. in a drying oven. The material was then washed with a mixture of 2,2,2-trifluoroethyl 1,1,2,2-tetrafluoroethyl ether (93.7% by mass) and ethanol (6.3% by mass) using ultrasound. The exposure time was 20 seconds. After this, the flux had been completely removed from the base material.

EXAMPLE 2

Example 2 was carried out in the same way as Example 1, except that "Zeva C30-300" supplied by the Zevatron company (main constituent, apart from activators, colophony) was used as soldering flux. After an exposure time of 20 seconds, the flux had been completely removed.

EXAMPLE 3

Example 3 was carried out in the same way as Example 1, except that "Flux 100" supplied by the ERSA company (main constituent, apart from activators, colophony) was used as soldering flux. After an exposure time of 20 seconds, the flux had been completely removed.

We claim:

1. An azeotropic or like mixture which consists essentially of about 90–97% by mass of 2,2,2-trifluoroethyl 1,1,2,2-tetrafluoroethyl ether and about 3–10% by mass of ethanol, said mixture having a boiling point at 1 bar of about 53° C. and wherein the composition of said mixture does not substantially change upon evaporation.

2. An azeotropic mixture as claimed in claim 1 which consists essentially of about 92-95% by mass of 2,2,2-trifluoroethyl 1,1,2,2-tetrafluoroethyl ether and about 5-8% by mass of ethanol.

3. An azeotropic mixture as claimed in claim 1 which consists essentially of about 93.6-93.8% by mass of 2,2,2-trifluoroethyl 1,1,2,2-tetrafluoroethyl ether and about 6.2-6.4% by mass of ethanol.

4. An azeotropic or azeotrope-like mixture as claimed in claim 1 which consists essentially of 93.7% by mass of 2,2,2-trifluoroethyl 1,1,2,2-tetrafluoroethyl ether and 6.3% by mass of ethanol and has a boiling point of 53.1° C. at 1 bar.

5. A process for cleaning electrical or electronic components, which comprises washing the components with an or azeotrope-like mixture as claimed in claim 1.

6. A process for removing soldering fluxes from a surface which comprises washing said surface with the azeotrope-like mixture as claimed in claim 1.

7. A process for cleaning a solid surface, which comprises washing the solid surface with an azeotrope-like mixture as claimed in claim 1.

8. A process according to claim 7 wherein said components are soldered circuit boards or printed circuits.

* * * * *